United States Patent [19]

Kanemaru et al.

[11] Patent Number: 5,150,038
[45] Date of Patent: Sep. 22, 1992

[54] SYSTEM FOR DETECTING THE EXTRAORDINARY APPROACH OF OBJECTS HAVING EARTH POTENTIAL TOWARD A POWER TRANSMISSION LINE

[75] Inventors: Kimiharu Kanemaru; Junichi Kaitou, both of Hitachi, Japan

[73] Assignee: Hitachi Cable Limited, Tokyo, Japan

[21] Appl. No.: 737,633

[22] Filed: Jul. 30, 1991

Related U.S. Application Data

[63] Continuation of Ser. No. 340,612, Apr. 19, 1989, abandoned.

[30] Foreign Application Priority Data

Sep. 27, 1988 [JP] Japan ............... 63-239761

[51] Int. Cl.⁵ .................................... G01R 31/02
[52] U.S. Cl. .................... 324/72.5; 324/457; 340/562
[58] Field of Search ............... 324/72, 72.5, 126, 127, 324/123 R, 457, 133; 340/561, 562

[56] References Cited

U.S. PATENT DOCUMENTS

| | | |
|---|---|---|
| 3,309,690 | 3/1967 | Moffitt . |
| 3,786,681 | 1/1974 | Moffitt . |
| 4,007,418 | 2/1977 | Hanna .................. 324/133 |
| 4,328,461 | 5/1982 | Butters . |
| 4,384,289 | 5/1983 | Stillwell . |
| 4,571,539 | 2/1986 | Rodriguez . |
| 4,611,207 | 9/1986 | Anderson . |
| 4,714,915 | 12/1987 | Hascal .................. 324/433 |
| 4,794,327 | 12/1988 | Fernandes ............. 324/127 |
| 4,795,973 | 1/1989 | Smith .................... 324/126 |
| 4,845,476 | 7/1989 | Rangeard .............. 340/660 |
| 4,891,576 | 1/1990 | Jacobs . |

*Primary Examiner*—Kenneth A. Wieder
*Assistant Examiner*—Jose M. Solis
*Attorney, Agent, or Firm*—Dykema Gossett

[57] ABSTRACT

A detector for detecting an extraordinary approach of objects having earth potential toward a power transmission line comprises a charging current detection circuit for measuring variations in a charging flowing from the power transmission line into a stray capacitance formed between a detector casing and the earth and a transmitter for sending the value measured by the charging current detection circuit to a receiver installed outside the detector casing by wireless means or a wire. The detector is always able to monitor the extraordinary approach of objects such as trees toward the power transmission line, thereby preventing in advance the accidental grounding of the line.

12 Claims, 1 Drawing Sheet

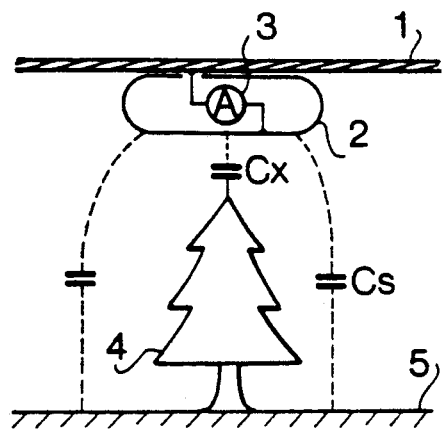 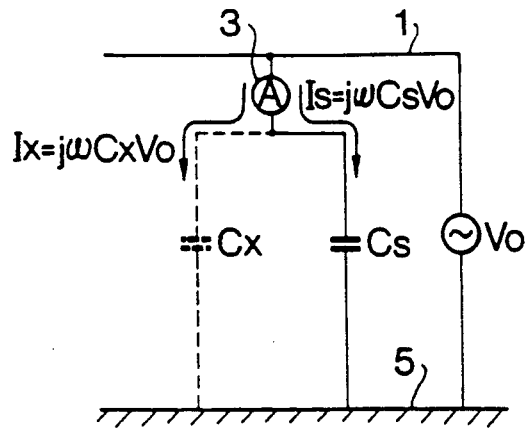
FIG.1A  FIG.1B
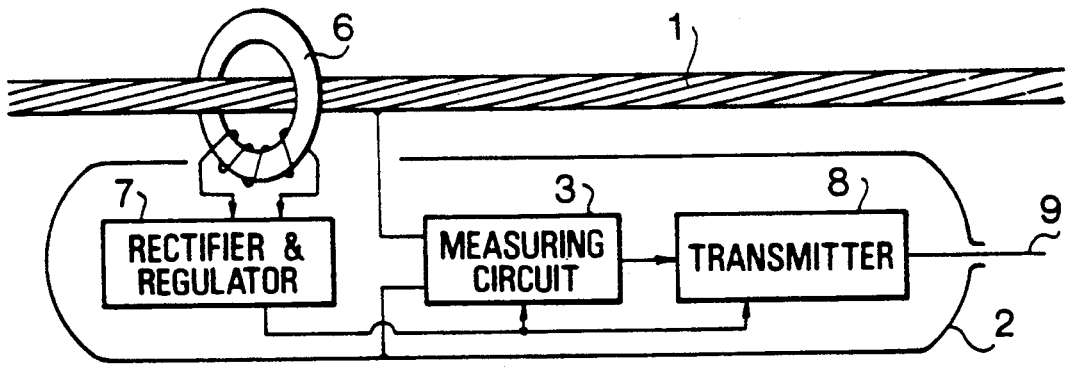
FIG.2
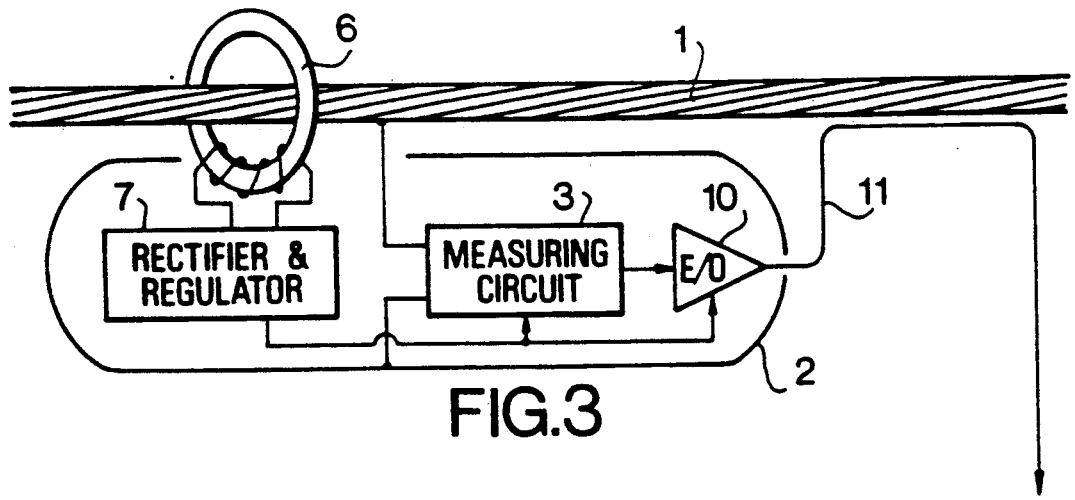
FIG.3

SYSTEM FOR DETECTING THE EXTRAORDINARY APPROACH OF OBJECTS HAVING EARTH POTENTIAL TOWARD A POWER TRANSMISSION LINE

This is a continuation of copending application(s) Ser. No. 07/340,612 filed on Apr. 19, 1989, now abandoned.

BACKGROUND OF THE INVENTION

1. Technical Field

The present invention relates to a system for detecting an extraordinary approach of an electrically grounded object toward, and into proximity with, a power transmission line and a device suitable for detecting the same.

2. Background Art

Breakdowns and accidents involving power transmission lines can result in interruptions in electrical service to businesses and communities, which have a major economic and social impact.

One accident that can occur in a high-voltage power transmission line is that of grounding due to an extraordinary approach by or contact with trees, machines such as cranes, buildings or the like. In the case of new construction, it is possible to prevent grounded objects from coming into contact or proximity with power transmission lines by appropriate planning and preventive measures. But, where these preventive measures cannot be implemented, for instance in mountainous areas with thick tree growth, preventive measures against such accidents have not been available other than performing a human tour of the power lines to inspect them.

A great deal of effort is therefore wasted in touring and inspecting power transmission lines over long distances in mountainous areas where the inspection work itself is very difficult to carry out. Since it is impossible to continuously monitor power transmission lines by inspection tours, total prevention of accidents is not possible.

SUMMARY OF THE INVENTION

One object of the present invention is to provide a detector which prevents serious accidents to a power transmission line by promptly detecting the extraordinary approach of objects into proximity with the power transmission line.

According to an embodiment of the present invention, a device for the extraordinary approach of electrically grounded objects into proximity with a power transmission line is provided, which includes, in a detector casing suspended from the power transmission line, a charging current detecting circuit for measuring variations in a charging current flowing from the power transmission line into a stray capacitance which the detector case forms between itself and the earth and a transmitter for sending values measured by the charging current detecting circuit to a receiver installed outside of the detector case through a cable or wireless means.

The transmitter is of a wireless type in a case where the measured values from the charging current detecting circuit are sent by wireless means, whereas in a case where they are sent via a cable, the transmitter is preferably an electrical signal/optical signal converter for converting the detected result to an optical signal. In the latter case, the transmitter sends the converted optical signals via the optical fiber to a receiver which is grounded (is at earth potential), for instance, on a steel tower.

In the above-mentioned configurations, measured values are transmitted by wireless means or wire. A configuration in which measured values are evaluated prior to transmission is also employed. For example, according to a second embodiment of the present invention, there is provided an approaching object detector which includes a charging current detecting circuit for measuring variations in a charging current flowing from a power transmission line into a stray capacitance defined between the detector case and the earth, an evaluation means for judging the extraordinary approach of objects having earth potential to a power transmission line on the basis of the value measured by the charging current detecting circuit, and a transmitter for sending the evaluated result to a receiver installed outside of the detector case by wireless means or a wire.

The detection length is determined by the casing length along the power transmission line, and therefore the detector casing may be extended along the power transmission line, so that a segment of the power transmission line to be detected is extended. In such a case, one portion of the detector casing may be directly extended, or an element having the shape of a cylinder, a wire, a twisted wire, a bar, or the like may be further provided, which element is insulated from the power transmission line.

The stray capacitance between the power transmission line and the earth varies as objects such as trees having an earth potential approach the power transmission line, whereby variations in a charging current flowing from the power transmission line into the stray capacitance are measured by the charging current detecting circuit. The measured value is sent directly to a receiver from a transmitter by wireless means or a wire. Then, the extraordinary approach of trees toward a power transmission line is detected by a certain evaluation device provided in the receiver side, or it is detected by an evaluation means provided in a detector case before the measured value is transmitted. In the latter case, the detection result is sent to the receiver by a transmitter via a wire or wireless means. The extraordinary approach of the objects toward the power transmission line can therefore always be monitored accurately.

The length of the power transmission line to be detected is determined by the length of the casing, so that one detector can cover a relatively long segment of the power transmission line by employing a longer casing or by attaching to the casing another element which substantially extends the casing length.

BRIEF DESCRIPTION OF THE DRAWINGS

FIGS. 1A and 1B respectively illustrate a principle and an equivalent circuit diagram explaining the operation of a detector for detecting the extraordinary approach of objects into proximity with a power transmission line according to the present invention;

FIG. 2 is a block diagram showing an embodiment of a detector according to the present invention; and FIG. 3 is a block diagram showing another embodiment of a detector according to the present invention.

DESCRIPTION OF THE PREFERRED EMBODIMENTS

Embodiments of the present invention will now be described in detail with reference to the accompanying drawings.

Referring to FIGS. 1A and 1B, a detector 2 suspended from a power transmission line 1 forms a stray capacitance Cs between itself and the earth surface 5. Since the detector 2 is connected via a charging current measuring circuit 3 having a low impedance to the power transmission line 1, a charging current It is normally measured by the charging current measuring circuit 3. The charging current It is given by the following expression:

$$Is = j\omega Cs \times Vo \qquad (1)$$

where Vo is a voltage to ground of the power transmission line 1.

If a tree 4 approaches the power transmission line 1, the capacitance Cs is added with a capacitance Cx, and a charging current measured by the charging current measuring circuit 3 is increased by a charging current Ix which charges a capacitance Cx increased by the tree 4 as shown in the following expression:

$$\begin{aligned} Is + Ix &= j\omega Cs \cdot Vo + j\omega Cx \cdot Vo \\ &= j\omega(Cs + Cx) \cdot Vo \end{aligned} \qquad (2)$$

Accordingly, it is possible to detect the extraordinary approach of objects such as trees into proximity with the power transmission line without delay by always monitoring variations (increases) in the charging current by means of the charging current measuring circuit 3.

Referring to FIG. 2, the power transmission line 1 has a detector casing 2 suspended therefrom, in the inside of which casing there is provided the charging current measuring circuit 3 connected with the detector case 2 and the power transmission line 1. Further, a wireless transmitter 8 is installed in the detector casing 2. The value of the charging current measured by the charging current measuring circuit 3 is sent to a ground-based receiver (not shown) located at a remote place, in the form of a radio signal leaving from a wireless antenna 9 protruding from the casing 2. The power source for each circuit in the detector case 2 is supplied from the current flowing through the power transmission line 1 by a through-type current transformer 6 mounted on the power transmission line 1 and a power source circuit 7 provided in the detector casing 2. Therefore, maintenance associated with the replacement of batteries is unnecessary. The value of the charging current sent to the receiver is evaluated by an evaluation device (not shown), from which it is determined whether or not objects such as trees or the like which have an earth potential approach the power transmission line 1.

FIG. 3 depicts another detector according to the present invention. This embodiment is quite similar in principle to that described above in connection with FIGS. 1A and 1B, as well as the embodiment shown in FIG. 2. In the embodiment shown in FIG. 3, however, an electrical signal/optical signal converter 10 is installed as a wire transmitter in the detector case 2. Therefore, an output from the charging current measuring circuit 3 is converted to an optical signal by the converter 10, and the optical signal thusly obtained is transmitted to a ground-based receiver (not shown) located at a remote place via an optical fiber 11.

The detection length along the power transmission line 1 can be extended by employing a detector casing 2 which extends longer along the power transmission line or by attaching an element which substantially, effectively extends the casing length since the stray capacitance Cs varies with the length of the casing 2. Such element may take the shape of a cylinder, a wire, a twisted wire or a bar. This means that one detector can provide detection over a relatively long segment of the power transmission line.

In the foregoing embodiment, the value measured by the charging current measuring circuit 3 is directly sent to the receiver by wireless means or a wire, but the same may be evaluated before being sent to the receiver. More specifically, an evaluation means (not shown) for determining the extraordinary approach of objects on the basis of the value measured by the charging current measuring circuit 3 is installed in the detector case 2, and the evaluation result is then sent to a receiver installed outside the detector 2 from a transmitter by wireless means or a wire. In this case, the evaluation means may include a comparator which compares the measured value with a predetermined threshold value.

As described above, according to the detector of the present invention, it is possible to always monitor the extraordinary approach of objects such as trees into proximity with a power transmission line. Therefore, accidental grounding to the extraordinary approach of the object toward or contact thereof with a power transmission line is prevented in advance.

What is claimed is:

1. A system for detecting the extraordinary approach of objects having an earth potential into proximity with a power transmission line, comprising:
   a detector suspended from the power transmission line for detecting said extraordinary approach, said detector including
   a detector casing,
   mounting means at the top of the casing and attachable with the power transmission line for mounting the detector casing on the line so as to be suspended from and wholly disposed beneath the line, the entire casing defining an electrode forming stray capacitance to the ground,
   a charging current detecting circuit within the detector casing for measuing variations in a charging current flowing from the power transmission line into a stray capacitance formed between the detector casing and the earth, and
   a transmitter within the detector casing for transmitting values measured by the charging current detecting circuit; and
   a receiver remote from the detector casing for receiving and evaluating the values transmitted by said transmitter.

2. A system for detecting the approach of objects having an earth potential toward a power transmission line, comprising:
   a detector suspended from the power transmission line for detecting said approach, said detector including -
   a detector casing,
   mounting means at the top of the casing and attachable to the power transmission line for mounting the detector casing on the line so as to be suspended from and wholly disposed beneath the line, the entire casing defining an electrode forming stray capacitance to the ground, a charging current detecting circuit contained in the detector casing for measuring variations in a charging current flowing from the power transmission line into a stray capacitance formed between the detector casing and the earth, evaluation means for detecting said approach by evaluating the values of the charging current measured by said detecting circuit, and a transmitter for transmitting the evaluated result from the evaluation means to the outside of the detector casing; and a receiver outside of the detector casing for receiving the evaluated result from said transmitter.

3. A detector for detecting the extraordinarily close approach of objects having an earth potential to a power transmission line, comprising:

a detector casing;

mounting means at the top of the casing and attachable to the power transmission line for mounting the detector casing on the line so as to be suspended from and wholly disposed beneath the line, the entire casing defining an electrode forming stray capacitance to the ground, a charging current detecting circuit contained in said detector casing for measuring variations in charging current flowing from the power transmission line into a stray capacitance formed between said detector casing and the earth; and a transmitter contained in said detector casing for transmitting the measured value of said charging current to outside of said detector casing.

4. A detector according to claim 3, wherein said transmitter includes an electrical signal to optical signal converter, and an optical fiber extending from said converter out of the detector casing.

5. A detector according to claim 3, wherein said detector casing includes a portion protruding from the detector casing, so as to increase the effective length of the detector casing.

6. A detector according to claim 3, wherein the mounting means includes a through-type current transformer mounted on the power transmission line, and a power supply circuit connected to the current transformer and contained in the detector casing.

7. A detector for detecting the approach of objects having earth potential into proximity with a power transmission line, comprising:

a detector casing;

mounting means at the top of the casing and attachable to the power transmission line for mounting the detector casing on the line so as to be suspended from and wholly disposed beneath the line, the entire casing defining an electrode forming stray capacitance to the ground, a charging current detecting circuit in said detector casing for measuring variations in a charging current flow from the power transmission line into a stray capacitance formed between said detector casing and the earth;

evaluation means for detecting said approach of said objects into proximity with the power transmission line based on variations of said charging current measured by said detecting circuit and for producing evaluation results; and transmitter means for transmitting the evaluation results produced by said evaluation means to a receiver installed outside of said detector casing.

8. A detector according to claim 7, wherein said transmitter includes an electrical signal to optical signal converter, and an optical fiber extending from said converter out of the detector casing.

9. A detector according to claim 7, wherein said detector casing includes a portion protruding from the detector casing, so as to increase the effective length of the detector casing.

10. A detector according to claim 7, further including a through-type current transformer mounted on the power transmission line, and a power supply circuit connected to the current transformer and contained in the detector casing.

11. A detector for detecting the approach of objects from the earth into proximity with power transmission line comprising:

a detector casing;

mounting means at the top of the casing and attachable to the power transmission line for mounting the detector casing on the line so as to be suspended from and wholly disposed beneath the line, the entire casing defining an electrode forming stray capacitance to the ground, a charging current detecting circuit in said detector casing for measuring variations in a charging current flowing from the power transmission line into a stray capacitance formed between said detector casing and the earth; and transmitter means for transmitting a signal to a receiver installed outside of said detector casing, said signal giving an indication of the proximity of extraordinary objects to the power transmission line.

12. A detector according to claim 7, wherein said evaluation means compares said charging current to a predetermined threshold value, and sends a signal based on this comparison to said receiver.

* * * * *

UNITED STATES PATENT AND TRADEMARK OFFICE
CERTIFICATE OF CORRECTION

PATENT NO. : 5,150,038

DATED : September 22, 1992

INVENTOR(S) : Kanemaru et al.

It is certified that error appears in the above-identified patent and that said Letters Patent is hereby corrected as shown below:

Column 4, line 48, change "measuing" to --measuring--.

Signed and Sealed this

Twenty-eighth Day of September, 1993

Attest:

BRUCE LEHMAN

Attesting Officer     Commissioner of Patents and Trademarks